United States Patent [19]
Nashimoto

[11] Patent Number: 5,834,803
[45] Date of Patent: Nov. 10, 1998

[54] ORIENTED FERROELECTRIC THIN FILM ELEMENT AND PROCESS FOR PREPARING THE SAME

[75] Inventor: Keiichi Nashimoto, Minami-ashigara, Japan

[73] Assignee: Fuji Xerox Co., Ltd., Tokyo, Japan

[21] Appl. No.: 919,576

[22] Filed: Nov. 6, 1995

[30] Foreign Application Priority Data

Nov. 11, 1994 [JP] Japan .................................. 6-301698
Oct. 27, 1995 [JP] Japan .................................. 7-280168

[51] Int. Cl.$^6$ .................................................. H01L 29/76
[52] U.S. Cl. ........................ 257/295; 257/310; 428/620; 501/12
[58] Field of Search ...................... 257/295, 306, 257/310; 427/126.3; 428/620; 501/12, 10, 134

[56] References Cited

U.S. PATENT DOCUMENTS

| | | | |
|---|---|---|---|
| 5,011,796 | 4/1991 | Bridger et al. | 501/12 |
| 5,206,788 | 4/1993 | Larson et al. | 257/295 |
| 5,442,585 | 8/1995 | Eguchi et al. | 257/306 |
| 5,567,979 | 10/1996 | Nashimoto et al. | 257/295 |
| 5,645,885 | 7/1997 | Nishimoto | 427/126.3 |
| 5,656,382 | 8/1997 | Nashimoto | 428/620 |

OTHER PUBLICATIONS

Nashimoto et al., "Epitaxial Growth of MgO on GaAs(001) for Growing Epitaxial BaTiO$_3$ Thin Films by Pulsed Laser Deposition", Appl. Phys. Lett. 60 (10), Mar. 9, 1992, pp. 1199–1201.

Nashimoto et al., "Epitaxial LiNbO$_3$ Thin Films Prepared by a sol–gel Process", Materials Letters, vol. 10, No. 7,8, Jan. 1991, pp. 348–354.

*Primary Examiner*—Sara W. Crane
*Attorney, Agent, or Firm*—Oliff & Berridge, PLC

[57] ABSTRACT

An oriented ferroelectric thin film element, which comprises a single-crystal substrate having thereon (a) a first epitaxial or oriented ferroelectric thin film prepared by a gas phase growth method and (b) a second epitaxial or oriented ferroelectric thin film prepared by application of a coating solution of an organic metal compound to the first ferroelectric thin film followed by heating the coated material. The oriented ferroelectric thin film element has a smooth surface and is useful as an optical guide element, light modulation element, etc. The second ferroelectric thin film can be formed by repeating the process of application of a coating solution of an organic metal compound followed by heating the coated material several times. The present invention also discloses a process for preparing the oriented ferroelectric thin film element.

17 Claims, 1 Drawing Sheet

ORIENTED FERROELECTRIC THIN FILM ELEMENT AND PROCESS FOR PREPARING THE SAME

FIELD OF THE INVENTION

The present invention relates to an epitaxial or oriented ferroelectric thin film element having a smooth surface which is useful as an optical guide element, light modulation element, etc. The epitaxial or oriented thin film element of the present invention is produced by forming an epitaxial or oriented ferroelectric thin film on a single crystal substrate using a gas phase growth method and a growth method involving heat crystallization of an organic metal compound. The present invention also relates to the process for the preparation of the epitaxial or oriented ferroelectric thin film element.

BACKGROUND OF THE INVENTION

Because of its various properties such as ferroelectricity, piezoelectricity, pyroelectricity and electro-optical effect, an oxide ferroelectric thin film has heretofore been expected to find wide application including non-volatile memory, surface elastic wave element, infrared pyroelectric element, optoacoustic element and lectro-optical element. Among these application, when such an oxide ferroelectric thin film is used as an optical guide structure, the production of a single-crystal thin film is indispensable to obtain polarizability and electro-optical effect as good as single crystal with reducing light loss. Therefore there has been many prior practices employing a gas phase growth method such as Rf-magnetron sputtering, laser ablation and organic metal chemical vapor deposition (MOCVD) to form an epitaxial ferroelectric thin film of $BaTiO_3$, $PbTiO_3$, $Pb_{1-x}La_x(Zr_{1-y}Ti_y)_{1-x/4}O_3$(PLZT), $LiNbO_3$, $KNbO_3$ or the like on an oxide single-crystal substrate.

However, the formation of a ferroelectric thin film by a gas phase epitaxial growth method is disadvantageous in that the resulting thin film normally increases in surface roughness with the increase in its thickness, thereby giving too high light scattering caused by the surface roughness of the film when used as an optical guide.

In order to integrate an optical guide made of ferroelectric thin film with a semiconductor element, it is necessary that a ferroelectric thin film be formed on a semiconductor substrate. However, the epitaxial growth of a ferroelectric thin film on a semiconductor substrate can be hardly conducted because the process must be effected at an elevated growth temperature, mutual diffusion occurs between the semiconductor and the ferroelectric material, and the semiconductor is oxidized.

The inventors previously found that MgO can be epitaxially grown on GaAs(100) by a gas phase growth method and the use of MgO film as a buffer layer allows a ferroelectric thin film to be epitaxially grown on a semiconductor. This invention was already applied for JP-A-5-327034 (the term "JP-A" as used herein means an "unexamined published Japanese patent application") and later published in "Appl. Phys. Lett. 60, 1199 (1992)".

The crystallographic relationship on the foregoing ferroelectric thin film comprises $BaTiO_3(001)//MgO(100)//GaAs(100)$ with reference to $BaTiO_3$. The in-plane orientation is $BaTiO_3[100]//MgO[001]//GaAs[001]$.

However, the gas phase epitaxial growth of a ferroelectric thin film on a GaAs substrate having a MgO layer formed thereon is also disadvantageous in that the resulting thin film normally increases in surface roughness with the increase in its thickness, thereby giving too high light scattering caused by the surface roughness of the film when used as an optical guide.

On the other hand, the formation of a ferroelectric thin film with an organic metal compound by a sol-gel method or the like is advantageous in the light of precision in the control of chemical composition, enhancement of surface smoothness, reduction of the process temperature, enlargement of the area, reduction of the facility cost, etc. The inventors found that the use of a non-hydrolytic organic metal compound in a sol-gel method allows the epitaxial growth of a single-crystal ferroelectric thin film on a single-crystal substrate. This knowledge was published in "Mater. Lett. 10348 (1991)". However, the sol-gel method is disadvantageous in that atomic mobility is low on the surface of the substrate during the growth of crystal as compared with a gas phase epitaxial growth method and that the thin film which can be epitaxially grown is restricted depending on the mutual crystallographic compatibility between the substrate and the thin film.

SUMMARY OF THE INVENTION

Therefore, an object of the present invention is to provide an oriented ferroelectric thin film element which has a smooth surface and which is useful as an optical guide, light modulation element or the like produced by forming an epitaxial or highly oriented ferroelectric thin film on a single-crystal substrate using a gas phase growth method and a growth method involving application and subsequent heating of an organic metal compound.

Another object of the present invention is to provide a process for preparing the foregoing oriented ferroelectric thin film element.

A gas phase growth method has heretofore been disadvantageous in that the resulting thin film increases in surface roughness with the increase in its thickness. A growth method involving application and subsequent crystallization of an organic metal compound (sol-gel method) is disadvantageous in that the epitaxial growth is restricted depending on the combination of a thin film and a substrate. The present inventors found that an excellent oriented ferroelectric thin film element is obtained by combining these methods and utilizing advantages in each of the methods. That is, the gas phase growth method is advantageous in that the combination of a thin film and a substrate can be easily selected for achieving epitaxial growth and the epitaxial growth temperature is relatively low, and the sol-gel method is advantageous in that the surface of the resulting thin film can be easily smoothened and the composition thereof can be easily controlled.

Thus, the above objects of the present invention has been achieved by providing:

an oriented ferroelectric thin film element, which comprises a single-crystal substrate having thereon:
  (a) a first epitaxial or oriented ferroelectric thin film prepared by a gas phase growth method; and
  (b) a second epitaxial or oriented ferroelectric thin film prepared by application of a coating solution of an organic metal compound to the first ferroelectric thin film followed by heating the coated material; and
a process for preparing an oriented ferroelectric thin film, which comprises:
  forming a first epitaxial or oriented ferroelectric thin film on a single-crystal substrate by a gas phase growth method;

applying a coating solution of an organic metal compound to the first ferroelectric thin film; and then heating the coated material to form a second epitaxial or oriented ferroelectric thin film on the first ferroelectric thin film.

According to the present invention, the thickness of the second epitaxial or oriented ferroelectric thin film can be increased by repeating the process of application of a coating solution of an organic metal compound followed by heating the coated material several times.

DETAILED DESCRIPTION OF THE INVENTION

The detailed description of the present invention will be further described with reference to the accompanied drawings.

Figure 3:
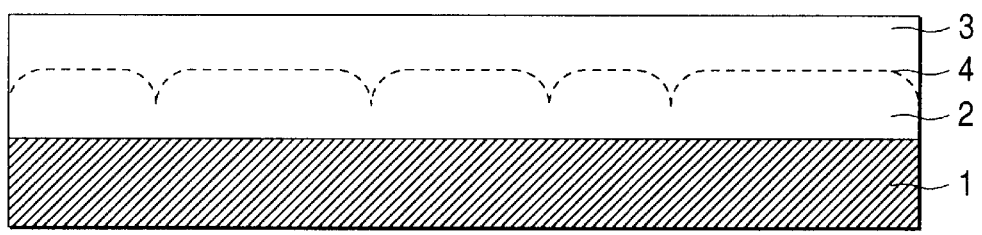
FIG. 3 is a typical sectional view of one embodiment of the oriented ferroelectric thin film element of the present invention having two epitaxial ferroelectric thin films formed on a single-crystal substrate by a gas phase growth method and a growth method involving heat crystallization of an organic metal compound.

FIG. 3 is a schematic sectional view of the structure of an oriented ferroelectric thin film element prepared in accordance with the process of the present invention.

Figure 1:
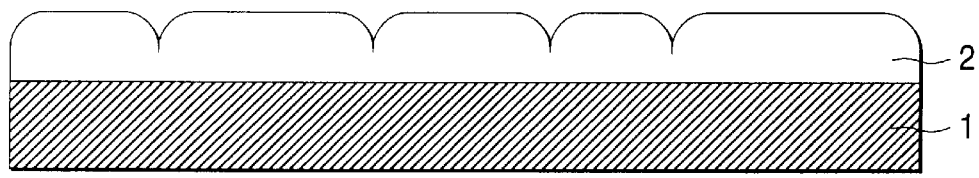
FIG. 1 is a typical sectional view exhibiting a state that an epitaxial thin film has been formed on a single-crystal substrate by a gas phase growth method.
Figure 2:
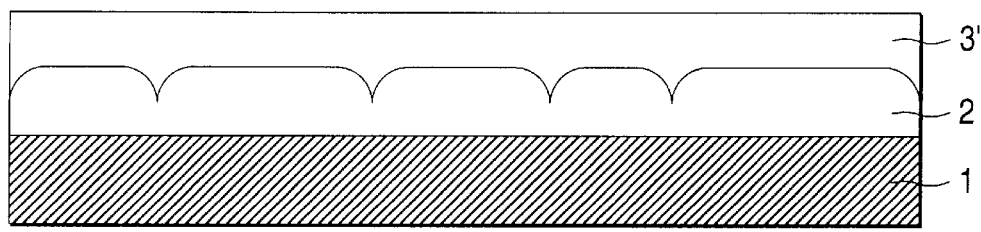
FIG. 2 is a typical sectional view exhibiting a state that an organic metal compound has been applied to the gas phase-grown epitaxial thin film on a single-crystal substrate to smoothen the surface of the thin film.
Figure 4:
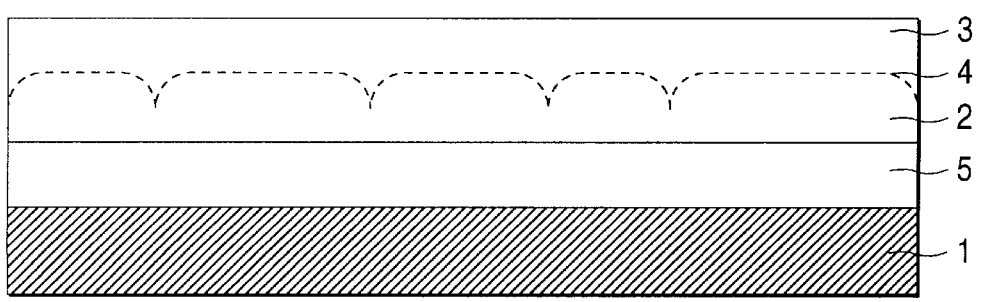
FIG. 4 is a typical sectional view of another embodiment of the ferroelectric thin film element of the present invention in which the single-crystal substrate has an epitaxial buffer layer provided thereon.

In FIGS. 1 to 3, reference numeral 1 indicates a single-crystal substrate, and reference numeral 2 indicates a first epitaxial ferroelectric thin film layer formed by a gas phase growth method. In FIG. 2, reference numeral 3' indicates a coating layer made of an organic metal compound solution. In FIG. 3, reference numeral 3 indicates a second epitaxial ferroelectric thin film layer formed by heat crystallization of the coating layer 3' of FIG. 2, and reference numeral 4 indicates the interface between the first ferroelectric thin film layer and the second ferroelectric thin film layer. In Fig. 4, reference numeral 5 indicates an epitaxial buffer layer provided on the single-crystal substrate.

The oriented ferroelectric thin film element of the present invention is prepared as follows. First, a first epitaxial or oriented ferroelectric thin film 2 having a rough surface is formed on a single-crystal substrate 1 by a gas phase growth method as shown in FIG. 1. Then, a coating layer 3' of an organic metal compound solution is applied on the thin film 2 as shown in FIG. 2. Subsequently, a second epitaxial or oriented ferroelectric thin film 3 having a smooth surface is formed by heat crystallization of the coating layer 3' as shown in FIG. 3. In this arrangement, the thickness of the second epitaxial ferroelectric thin film 3 can be increased by repeating the application of the organic metal compound followed by heating the coated material several times.

The single-crystal substrate 1 for use in the oriented ferroelectric thin film element of the present invention preferably include single crystal substrates of oxide such as MgO, $Al_2O_3$, $MgAl_2O_4$, $ZrO_2$, ZnO, $SrTiO_3$, $LiNbO_3$ and $LiTaO_3$, semiconductor single crystal substrates such as single semiconductors (e.g., Si, Ge, diamond), semiconductors of the group III to V compound (e.g., AlAs, AlSb, AlP, GaAs, GaSb, InP, InAs, InSb, AlGaP, AlLnP, AlGaAs, AlInAs, AlAsSb, GaInAs, GaInSb, GaAsSb, InAsSb) and semiconductors of the group II to VI (e.g., ZnS, ZnSe, ZnTe, CaSe, CdTe, HgSe, HgTe, CdS), and substrates obtained by forming the epitaxial buffer layer 5 on these semiconductor single crystal substrates by a gas phase growth method. Examples of a material for the epitaxial buffer layer 5 preferably include MgO, $MgAl_2O_4$, $ZrO_2$, $Y_2O_3$—$ZrO_2$ and $CeO_2$. the first ferroelectric thin film 2 for use in the present invention can be formed from a ceramic, a single crystal, a metal or the like as a starting material by electron beam deposition method, flash deposition method, ion plating method, high frequency Rf-magnetron sputtering method, ion beam sputtering method, laser ablation method, eximer laser deposition method, ionized cluster beam epitaxy method, molecular beam epitaxy method (MBE) or the like or can be formed from an organic metal compound or a metal halide as a starting material by a gas phase growth method selected from chemical vapor deposition method (CVD), plasma CVD method and organic metal chemical vapor deposition method (MOCVD) or the like. The thickness of the first ferroelectric thin film layer 2 is preferably from 50 to 5,000 Å, particularly preferably from 50 to 1,000 Å.

The second ferroelectric thin film 3 can be formed from an organic metal compound selected from metal alkoxides or metallic salts of Li, K, Nb, Ta, Bi, Ba, Sr, Pb, La, Ti, Zr, Mg, etc. In some detail, the foregoing organic metal compound is prepared to have a predetermined composition. The organic metal compound is then dissolved in an organic solvent selected from alcohols, diketones, ketones, alkylesters, oxy acids and oxyketones, etc. The resulting solution is then applied to a single-crystal substrate by a coating method selected from spin coating method, dip coating method, spray coating method, screen printing method and ink jet method. Thereafter, the coated material is heated to a temperature of from 300° C. to 800° C. in an oxygen or oxygen-containing atmosphere to cause a ferroelectric thin film to undergo epitaxial growth in the form of a single crystal. The thickness of the ferroelectric thin film can be increased by repeating the application of the coating solution followed by heating the coated material predetermined times. It is effective to pre-treat the ferroelectric thin film by heating at a temperature of from 100° C. to 400° C., where the applied solution is not crystallized, prior to the heating. The thickness of the second ferroelectric thin film layer 3 is preferably from 100 to 10,000Å, particularly preferably from 1,000 to 10,000Å.

Examples of the foregoing first and second ferroelectric thin films include $ABO_3$ type ferroelectric substances such as $LiNbO_3$, $LiTaO_3$, $KNbO_3$, $BaTiO_3$, $PbTiO_3$, $La_x(Zr_{1-y}Ti_y)_{1-x/4}O_3$ $_{1-x/4}O_3$(PZT, PLT, PLZT) and $Pb(Mg_{1/3}Nb_{2/3})O_3$ $Nb_{2/3})O_3$ or substituted derivatives thereof. The first and second ferroelectric thin films preferably comprises the same ferroelectric substance but may be formed from different ferroelectric substances.

The total thickness of the first and second ferroelectric thin films is preferably from 1,000 to 10,000 Å.

The present invention will be further described in the following examples, but the present invention should not be construed as being limited thereto.

EXAMPLE 1

$LiNbO_3$ was epitaxially grown on a sapphire (0001) single-crystal substrate ($\alpha$-$Al_2O_3$) by Rf-magnetron sputtering method. Prior to this procedure, the substrate was washed with an organic solvent, etched with a solution of HCl, rinsed with deionized water, and then spin-dried with ethanol in a stream of nitrogen. The substrate thus spin-dried was immediately introduced into a deposition chamber where it was then subjected to Rf-magnetron sputtering at an electric power of 100 W and a substrate temperature of 500° C. in a 20 mTorr air or oxygen atmosphere with $LiNbO_3$ as a target so that a thin $LiNbO_3$ film having a thickness of 500 Å was grown.

Subsequently, the thin $LiNbO_3$ film thus obtained was subjected to the following sol-gel method so that a thin $LiNbO_3$ film having a thickness of 2,500 Å was further formed thereon. In some detail, in order to obtain an organic metal compound solution for use in sol-gel method, equimolecular amounts of $LiOC_2H_5$ and $Nb(OC_2H_5)_5$ were dissolved in 2-methoxyethanol ($CH_3OC_2H_4OH$) which had been dehydrated through a molecular sieve to prepare a 0.6M solution. The solution thus prepared was distilled at a temperature of 124.5° C. with stirring for 2 hours, and then further refluxed for 22 hours to obtain a solution of a composite metal alkoxide $Li[Nb(OC_2H_4OCH_3)_6]$. This alcohol substitution reaction was confirmed by $^1$H-NMR spectrum to have occurred. The production of the alkoxide having a precursor structure of $LiNbO_3$ is important to control Li/Nb ratio to 1/1 and to maintain the molecular uniformity of the organic metal compound.

Subsequently, the foregoing solution was passed through a filter having a pore diameter of 0.2 $\mu$m and then spin-coated at 2,000 rpm on the sapphire single-crystal substrate having thereon a thin $LiNbO_3$ film having a thickness of 500 Å grown by sputtering method. All these procedures were effected in an atmosphere of nitrogen. The substrate thus spin-coated was heated at a rate of 10° C./sec in an atmosphere of oxygen to a temperature of 300° C. where it was then kept for 2 minutes. The substrate was then kept at a temperature of 500° C. for 30 minutes. Eventually, the electric oven was turned off to let the material to cool. The procedure of spin coating and heating was then repeated twice to prepare a thin $LiNbO_3$ film having a total thickness of 3,000 Å.

The thin film thus obtained was analyzed for X-ray diffraction pattern. As a result, it was found that the thin $LiNbO_3$ film formed by the sputtering method and the sol-gel method is singly oriented to (0001) plane. The thin film was then identified for in-plane orientation by a X-ray pole figure. As a result, it was found that the crystal orientation in the plane of the sapphire single-crystal substrate corresponds to that in the $LiNbO_3$ substrate. The thin film was then measured for optical guide loss by He—Ne laser light introduced through a prism coupling. As a result, it was found that TEO mode is as relatively low as 10 dB/cm.

Comparative Example 1

$LiNbO_3$ was epitaxially grown on a sapphire (0001) single-crystal substrate ($\alpha$-$Al_2O_3$) by Rf-magnetron sputtering method. Prior to this procedure, the substrate was treated in the same manner as in Example 1. The substrate was subjected to Rf-magnetron sputtering in the same manner as in Example 1 so that a $LiNbO_3$ film having a thickness of from 1,000 to 4,000 Å.

The thin film thus obtained was then analyzed for X-ray diffraction pattern. As a result, it was found that the thin $LiNbO_3$ film is singly oriented on (0001) plane. The thin film was then identified for in-plane orientation by a X-ray pole figure. As a result, it was found that the crystal orientation in the plane of the sapphire single-crystal substrate corresponds to that in the $LiNbO_3$ substrate. In order to determine the relationship between the thickness and surface roughness of the thin $LiNbO_3$ film, the thin film was observed under a scanning electron microscope (SEM). As a result, it was found that the surface roughness of $LiNbO_3$ tends to increase with the increase in the thickness of $LiNbO_3$. The thin $LiNbO_3$ film having a thickness of 2,900 Å was measured for optical guide loss by He—Ne He—Ne laser light introduced through a prism coupling. As a result, it was found that TEO is as relatively high as 30 dB/cm.

EXAMPLE 2

An epitaxial $LiNbO_3$ thin film having a thickness of 2,800 Å was grown on a sapphire (0001) single-crystal substrate ($\alpha$-$Al_2O_3$) by Rf-magnetron sputtering method in the same manner as in Example 1. A $LiNbO_3$ thin film having a thickness of 700 Å was then formed on the epitaxial $LiNbO_3$ thin film by a sol-gel method in the same manner as in Example 1.

In the thin $LiNbO_3$ film which had been epitaxially grown on the sapphire single-crystal substrate by the sputtering method and sol-gel method, the spin coating of the second $LiNbO_3$ film made up for roughness of the first $LiNbO_3$ film and provided an extremely smooth surface. When the 3,500 Å-thick epitaxial $LiNbO_3$ thin film was measured for optical guide loss by He—Ne laser light introduced through a prism coupling, it was found that $TE_0$ is as relatively small as 9 dB/cm.

Incidentally, the foregoing first epitaxial $LiNbO_3$ thin film having a thickness of 2,800 Å was measured for optical guide loss by He—Ne laser light introduced through a prism coupling. As a result, it was found that TEO mode is as relatively high as 28 dB/cm.

EXAMPLE 3

A thin $PZT(Pb(Zr_{0.52}Ti_{0.48})O_3)$ film was formed on a MgO (100) single-crystal substrate by Rf-magnetron sputtering method and sol-gel method. Prior to this procedure, the substrate was washed with a solvent, rinsed with deionized water and ethanol, and then eventually spin-dried with ethanol in a stream of nitrogen. The substrate thus treated was then annealed at a temperature of 1,000° C. in an atmosphere of oxygen. The substrate thus annealed was immediately introduced into a deposition chamber where it was then subjected to Rf-magnetron sputtering at a power of 50 W and a substrate temperature of 500° C. in a 30 mTorr air or oxygen atmosphere with a PZT ceramic containing excess Pb as a target to obtain a thin PZT film having a thickness of 1,000 Å.

The thin film thus obtained was then analyzed for X-ray diffraction pattern. As a result, it was found that the PZT layer formed on the MgO substrate is an epitaxial film singly oriented to (100) plane. In order to identify the relationship in in-plane crystal orientation, the thin film was subjected to X-ray diffraction phi scanning. It was found that the crystallographic relationship between PZT and MgO comprises PZT(001)//MgO(100) and in-plane orientation comprises PZT[100]//MgO[001].

A PZT layer was then formed on the Rf-magnetron-sputtered PZT layer by a sol-gel method as follows. In some detail, $Zr(O-i-C_3H_7)_4$, $Ti(O-i-C_3H_7)$, and $Pb(CH_3COO)_2(Pb(OAc)_2)$ which had been vacuum-dried at a temperature of 100° C., having a Pb : Zr : Ti molar ratio of 1.05 : 0.52 : 0.48, the Pb content being in excess to make up for the loss of Pb, were dissolved in 2-methoxyethanol ($CH_3OCH_2CH_2OH$ (ROH)). The solution was then distilled at a temperature of 120° C. for 10 hours to remove $CH_3COOCH_2CH_2OCH_3$ (AcOR) as a by-product from the solution having a metal complex $Pb(ZrTi)0_2(OR)_2$ formed therein. Thereafter, the solution was further distilled under reduced pressure to obtain a stable precursor solution having a final Pb concentration of 0.6M. All the foregoing procedures were effected in an atmosphere of nitrogen. The precursor solution was then spin-coated on the PZT-sputtered MgO (100) substrate at 2,000 rpm at room temperature in an atmosphere of nitrogen. The substrate thus spin-coated was heated at a temperature of 300° C. for 1 minute and then at a temperature of 550° C. for 30 minutes in an atmosphere of oxygen to effect crystallization. The process of spin coating and heating was then repeated three times to prepare a PZT thin film having a total thickness of 4,000 Å.

The thin film thus obtained was then analyzed for X-ray diffraction pattern. As a result, it was found that the PZT thin film prepared by the sputtering method and sol-gel method is an epitaxial perovskite single layer thin film having (001) plane orientation. The relationship in crystal orientation between PZT and MgO comprised PZT(001)//MgO(100) and in-plane orientation comprised PZT[100]//MgO[001]. The epitaxial PZT thin film was then observed for surface roughness by an atomic force microscope (AFM). As a result, it was found that the PZT thin film having a thickness of 4,000 Å exhibits a surface roughness of only 20 Å.

Comparative Example 2

When PZT was subjected to heat crystallization only by a sol-gel method, the heating temperature needed to be not lower than 650° C. to obtain a perovskite single layer. Under some conditions, a PZT thin film having a mixture of crystal faces other than (100) plane orientation, such as (110) plane orientation was obtained. When a sputtering method alone was employed to cause PZT to grow, it gave a tendency that the surface roughness of PZT thus grown increases with the increase in the thickness of the film thus formed.

EXAMPLE 4

An eximer laser deposition method involving the instantaneous heating of the surface of the target by UV laser pulse was employed to form an epitaxial MgO buffer layer on a GaAs (100) substrate.

In this procedure, an XeCl eximer laser (wavelength: 308 nm) was used as a laser. The laser was operated at a pulse frequency of 4 Hz, a pulse length of 17 ns and a pulse energy of 130 mJ. As a target there was used metallic Mg because MgO has no absorption at a wavelength of 308 nm. During the film formation, oxygen was introduced into the system to produce MgO.

Prior to this procedure, the substrate was washed with an organic solvent, etched with a $H_2SO_4$ solution, rinsed with deionized water and ethanol, and then spin-dried with ethanol in a stream of nitrogen. The substrate thus spin-dried was immediately introduced into a deposition chamber where it was then heated at a temperature of 600° C. and a background pressure of $3\times10^{-7}$ Torr to cause the passive layer on the surface of GaAs to be eliminated (sublimated). Subsequently, MgO was deposited on the substrate at a temperature of 350° C. in a $5\times10^{-6}$ Torr oxygen atmosphere to obtain a 500 Å-thick MgO thin film.

The MgO thin film thus obtained was then analyzed for X-ray diffraction pattern. As a result, it was found that the thin film is an epitaxial film singly oriented to (100) plane.

The thin film was subjected to X-ray diffraction phi scanning to identify the relationship in in-plane orientation between MgO and GaAs. The phi scan of (202) plane disposed at an angle of 45 degrees with respect to (100) plane in cubic system showed sharp peaks having a rotational frequency of 90 degrees with respect to MgO in MgO(100)/GaAs(100). This position corresponded to the peak position of GaAs. These results showed that the relationship in crystal orientation between MgO and GaAs comprises MgO(100)//GaAs (100) and the in-plane orientation comprises MgO[001]// GaAs[001].

$PbTiO_3$ was then epitaxially grown in situ on the MgO buffer layer at a temperature of 600° C. in a $1\times10^{-3}$ Torr oxygen atmosphere. The thin film was then analyzed for X-ray diffraction pattern. As a result, it was found that $PbTiO_3$ is oriented to (001) plane. The thin film was then subjected to phi scanning to identify the relationship in crystal orientation between $PbTiO_3$ and MgO/GaAs. The results were $PbTiO_3$ (001)//MgO(100)//GaAs(100) and $PbTiO_3$ [100]//MgO[001]// GaAs[001]. The surface of $PbTiO_3$ was observed under SEM. As a result, it was found that the thin film maintains a smooth surface up to a thickness of 1,000 Å but exhibits a mosaiclike surface when the thickness thereof is about 4,000 Å.

An epitaxial $PbTiO_3$ film having a thickness of 500 Å was then formed on the epitaxial MgO/GaAs substrate by a laser deposition method. $PbTiO_3$ was immediately formed on the epitaxial $PbTiO_3$ film by a sol-gel method. In some detail, $Ti(O-i-C_3H_7)_4$ was dissolved in 2-methoxyethanol ($CH_3OCH_2CH_2OH(ROH)$). $Pb(CH_3COO)_2(Pb(OAc)_2)$ which had been vacuum-dried at a temperature of 100° C. was dissolved in the solution in a Pb : Ti molar ratio of 1.05: 1.00. Thereafter, the solution was distilled at a temperature of 120° C. for 10 hours so that $CH_3COOCH_2CH_2OCH_3$ (AcOR) as a by-product was removed from the solution having a metal complex $PbTiO_2(OR)_2$ formed therein. The solution was then concentrated under reduced pressure to obtain a stable precursor solution having a Pb concentration of 0.6M. All these procedures were effected in an atmosphere of nitrogen. The precursor solution thus obtained was then spin-coated at 2,000 rpm on a $PbTiO_3(100)/MgO(100)/$ GaAs(100) substrate at room temperature in an atmosphere of nitrogen. The substrate thus obtained was heated at a temperature of 300° C. for 1 minute and then at a temperature of 600° C. for 30 minutes in an atmosphere of oxygen so that it was crystallized. The process of spin coating and heating was then repeated three times to obtain a $PbTiO_3$ thin film having a total thickness of 4,000 Å.

The thin film thus obtained was then analyzed for X-ray diffraction pattern. As a result, it was found that the $PbTiO_3$ film is a perovskite single layer oriented to (001) plane and the relationship in crystal orientation between $PBTiO_3$ and MgO//GaAs comprises $PbTiO_3(001)$// MgO(100)// GaAs (100).

As mentioned above, a 4,000 Å-thick epitaxial $PbTiO_3$ thin film was obtained by forming a first $PbTiO_3$ thin film by a laser deposition method, and then forming a second epitaxial $PbTiO_3$ film thereon by a sol-gel method. The surface of the $PbTiO_3$ thin film was then observed under SEM. As a result, it was confirmed that the thin film has no definite contrast and hence an extremely smooth surface.

EXAMPLE 5

$LiTaO_3$ was epitaxially grown on a sapphire (0001) single-crystal substrate ($\alpha$-$Al_2O_3$) by Rf-magnetron sputtering method. Prior to this procedure, the substrate was washed with an organic solvent, etched with a solution of HCl, rinsed with deionized water, and then spin-dried with ethanol in a stream of nitrogen. The substrate thus spin-dried was immediately introduced into a deposition chamber where it was then subjected to Rf-magnetron sputtering with LiTaO$_3$ as a target at an electric power of 100W and a substrate temperature of 600° C. in a 20mTorr air or oxygen atmosphere so that a thin LiTaO$_3$ film having a thickness of 100 Å was grown.

Subsequently, the thin LiTaO$_3$ film thus obtained was subjected to sol-gel method in the same manner as in Example 1 so that a thin LiNbO$_3$ film having a thickness of 2,900 Å was further formed thereon. In this procedure, a solution of a composite metal alkoxide Li[Nb(OC$_2$H$_4$OCH$_3$)$_6$]was passed through a filter having a pore diameter of 0.2 μm, and then spin-coated at 2,000rpm in an atmosphere of nitrogen on the thin LiTaO$_3$ film. The substrate thus spin-coated was heated at a rate of 10° C./sec in an atmosphere of oxygen to a temperature of 300° C. where it was then kept for 2 minutes. The substrate was then kept at a temperature of 700° C. for 30 minutes. Eventually, the electric oven was turned off to let the material to cool. The procedure of spin coating and calcining was then repeated twice to prepare a thin LiNbO$_3$/LiTaO$_3$ film having a total thickness of 3,000 Å.

The thin film thus obtained was then analyzed for X-ray diffraction pattern. As a result, the thin LiNbO$_3$/ LiTaO$_3$ film formed by the sputtering method and sol-gel method showed only a diffraction peak by (0001) plane. The thin film was then analyzed by a X-ray pole figure. As a result, it was found that the crystal orientation on the plane of the sapphire single-crystal substrate corresponds to that on the LiNbO$_3$/LiTaO$_3$ film.

The surface of the epitaxial LiNbO$_3$/LiTaO$_3$ thin film having a thickness of about 3,000 Å obtained by a process which comprises forming an epitaxial LiTaO$_3$ thin film as a first layer on a sapphire single-crystal substrate by a sputtering method, and then forming an epitaxial LiNbO$_3$ thin film as a second layer thereon by a sol-gel method showed no definite contrast even when observed by SEM. Thus, the surface of the epitaxial LiNbO$_3$/LiTaO$_3$ thin film was so smooth that it can be expected to exhibit a low light-decay performance suitable for use in optical guide.

EXAMPLE 6

A thin PZT[Pb(Zr$_{0.52}$Ti$_{0.48}$)O$_3$] film was formed on a SrTiO$_3$ (111) single-crystal substrate by MOCVD method and sol-gel method.

Prior to this procedure, the substrate was washed with an organic solvent, rinsed with deionized water and ethanol, and then spin-dried with ethanol in a stream of nitrogen. The substrate thus treated was immediately introduced into a deposition chamber where it was then subjected to MOCVD method with Pb(C$_2$H$_5$)$_4$, Zr(Dipivaloylmethane)$_4$ and Ti(i-OC$_3$H$_7$)$_4$ as starting materials to form a thin film thereon. This procedure was effected in an atmosphere of air or oxygen as a carrier gas at a substrate temperature of 600° C. to obtain a thin PZT film having a thickness of 500 Å. The thin film thus obtained was then analyzed for X-ray diffraction pattern. As a result, it was found that the PZT film formed on the SrTiO$_3$ substrate is an epitaxial film singly oriented to (111) plane and the inplane crystal orientation on PZT corresponds to that on SrTiO$_3$.

The PZT film thus formed on the SrTiO$_3$ substrate by MOCVD method was then subjected to sol-gel method to form a PZT film thereon. The sol-gel method was effected in almost the same manner as in Example 1. In some detail, a stable 0.6M Pb(ZrTi) 0$_2$(OCH$_2$0CH$_3$)$_2$ precursor solution was obtained. All these procedures were effected in an atmosphere of nitrogen.

The precursor solution thus obtained was then spin-coated at 2,000 rpm on the PZT/SrTiO$_3$ (100) substrate prepared by MOCVD method at room temperature in an atmosphere of nitrogen. The substrate thus spin-coated was heated at a temperature of 300° C. for 1 minute and then at a temperature of 600° C. for 30 minutes in an atmosphere of oxygen to effect crystallization. The procedure of spin coating and calcining was repeated four times to obtain a thin PZT film having a total thickness of 5,000 Å.

The thin film thus obtained was then analyzed for X-ray diffraction pattern. As a result, it was found that the PZT film formed by MOCVD method and sol-gel method is an epitaxial thin film oriented to (111) plane. The epitaxial PZT thin film thus obtained was observed for surface roughness by an atomic force microscope (AFM). As a result, the surface roughness of the epitaxial PZT thin film was only about 20 Å.

EXAMPLE 7

An epitaxial MgO buffer layer was formed on a Si single-crystal substrate by an eximer laser deposition method in the same manner as in Example 4. As the Si single-crystal substrate there was used a negative-type or positive-type (100) plane wafer. In this procedure, the substrate was washed with an organic solvent, etched with HF, and then dried. The substrate thus treated was immediately introduced into a deposition chamber where it was then subjected to eximer laser deposition at a temperature of 450° C. in a 5×10$^{-6}$ Torr oxygen atmosphere to form a MgO thin film having a thickness of about 600 Å thereon. Thus, an epitaxial thin film was obtained having a MgO—Si in-plane crystal orientation relationship comprising MgO(100)//Si (100) and MgO[100]//Si[100].

A thin PbTiO$_3$ film having a thickness of 100 Å was then epitaxially grown in situ on the MgO buffer layer at a temperature of 600° C. in a 1×10$^{-3}$Torr oxygen atmosphere in the same manner as in Example 4. The thin film was then analyzed for X-ray diffraction pattern. As a result, it was found that PbTiO$_3$ is oriented to (001) plane. The thin film was then subjected to phi scanning to identify the relationship in crystal orientation between PbTiO$_3$ and MgO/Si. The results were PbTiO$_3$(001)//MgO(100)//Si(100) and PbTiO$_3$ [001]//MgO[100]// Si[100].

The epitaxial PbTiO$_3$ film thus formed on the epitaxial MgO/Si substrate by laser deposition method was then immediately subjected to sol-gel method in the same manner as in Example 4 to form a PbTiO$_3$ film having a thickness of 3,500 Å thereon. A PbTiO$_2$(OCH$_2$CH$_2$OCH$_3$)$_2$ precursor solution was then spin-coated at 2,000rpm on the PbTiO$_3$ (100)//MgO(100)//Si(100) substrate at room temperature in an atmosphere of nitrogen. The substrate thus spin-coated was heated at a temperature of 300° C. for 1 minute and then at a temperature of 600° C. for 30 minutes in an atmosphere of oxygen to effect crystallization. The procedure of spin coating and calcining was then repeated three times to obtain a thin PbTiO$_3$ film having a total thickness of 3,600 Å. The thin film thus obtained was then analyzed for X-ray diffraction pattern. As a result, it was found that the PbTiO$_3$ film is a perovskite single layer having (001) plane orientation. The relationship in crystal orientation between PbTiO$_3$ and MgO/Si comprised PbTiO$_3$(001)// MgO(100)//Si(100).

The surface of the epitaxial PbTiO$_3$ film having a thickness of about 3,600 Å obtained by a process which comprises forming an epitaxial PbTiO$_3$ thin film as a first layer by laser deposition method, and then forming an epitaxial PbTiO$_3$ thin film as a second layer thereon by sol-gel method showed no definite contrast even when observed by SEM. Thus, the surface of the thin PbTiO$_3$ film was so smooth that it can be expected to exhibit a low light-decay performance suitable for use in optical guide.

A Pb$_{1-x}$La$_x$(Zr$_{1-y}$Ti$_y$)$_{1-x/4}$O$_3$(PLZT) film could be epitaxially grown on a Si substrate via an epitaxial MgO buffer layer in the same manner as mentioned above.

EXAMPLE 8

An epitaxial MgO buffer layer was formed on a Si (100) single-crystal substrate by an electron beam deposition method. As the single-crystal substrate there was used a negative-type or positive-type (100) plane wafer. In this procedure, the substrate was washed with a solvent, and then etched with a Hf solution. The substrate was then spin-dried with ethanol in a stream of nitrogen. The substrate thus spin-dried was immediately introduced into a deposition chamber. When the pressure in the deposition chamber reached the background pressure, the substrate was heated to a predetermined temperature (generally in the range of from 300° to 700° C.) where a MgO film was then grown thereon. As the target there was used MgO. The distance between the target and the substrate was from 50mm to 200mm. The electron beam current was from 5mA to 20mA. The temperature of the substrate was adjusted to from 600° C. by heating with a halogen lamp. Thus, under the conditions of a film forming rate of about 10.0 Å/sec and a film forming temperature of each of 370° C., 440° C. and 500° C., and under the conditions of a film forming rate about 3.0 Å/sec and a film forming temperature of 440° C., a film having a random in-plane orientation but a high orientation on (111) plane was obtained. A PLT (Pb/La/Ti=72/28/100) film having a thickness of 100 Å was then grown in situ on the 200 Å-thick MgO buffer layer at a temperature of 600° C. in a 1×10$^{-3}$ Torr oxygen atmosphere.

The PLT/MgO layer thus formed on the Si substrate was then immediately subjected to sol-gel method as in the foregoing examples to form a PLT layer thereon.

In some detail, La(O-i-C$_3$H$_7$)$_3$ and Ti(O-i-C$_3$H$_7$)$_4$ were dissolved in 2-methoxyethanol [CH$_3$OCH$_2$CH$_2$OH(ROH)] in a predetermined molar ratio. Subsequently, Pb(CH$_3$COO)$_2$ was dissolved in the solution in a Pb : La : Ti molar ratio of 0.75 : 0.28 : 1.0. The solution was then subjected to distillation at a temperature of 125° C. for 10 hours to produce a solution of a metal complex (Pb, La)TiO$_2$ (OCH$_2$—CH$_2$OCH$_3$)$_2$ while removing a by-product CH$_3$COOCH$_2$CH$_2$OCH$_3$ from the solution. Thereafter, the solution was concentrated under reduced pressure. Eventually, a stable precursor solution having a Ti concentration of 0.6M was obtained. The precursor solution thus obtained was then spin-coated on the PLT/MgO layer at room temperature in an atmosphere of nitrogen. The substrate thus spin-coated was heated at a temperature of 350° C. for 1 minute and then at a temperature of 650° C. for 1 minute in an atmosphere of oxygen to effect crystallization. The procedure of spin coating and calcining was then repeated three times. Subsequently, the substrate was heated to a temperature of 650° C. for 30 minutes to effect final crystallization to form a thin PLT film having a total thickness of 3,600 Å on the MgO buffer layer. Thus, a highly oriented PLT(111)//MgO(111)// Si(100) laminated structure having a random in-plane orientation was obtained.

The foregoing examples have been described with reference to Rf-magnetron sputtering method, eximer laser deposition method or organic metal chemical vapor phase grow method (MOCVD)and sol-gel method in combination. However, the present invention is not limited to these film-forming processes. Similarly, a gas phase growth method such as ion beam sputtering method, electron beam deposition method, flash deposition method, ion plating method, molecular beam epitaxy method (MBE), ionized cluster beam epitaxy method and chemical vapor growth method (CVD) and sol-gel method may be employed in combination. It is apparent that a thin film prepared by such a combined method exhibits the same effects as the thin film prepared in the foregoing examples.

The process of the present invention comprises a gas phase growth on a single-crystal substrate, and a growth method involving application of a coating solution of an organic metal compound followed by heating and crystallizing the coated material. In accordance with the process of the present invention, an epitaxial or oriented ferroelectric thin film having a smooth surface can be prepared from a variety of materials at a relatively low growth temperature. The oriented ferroelectric thin film thus obtained exhibits excellent properties, i.e., small optical guide loss and small light scattering, and thus is useful as an optical guide element, light modulation element, etc.

While the invention has been described in detail and with reference to specific embodiments thereof, it will be apparent to one skilled in the art that various changes and modifications can be made therein without departing from the spirit and scope thereof.

What is claimed is:

1. An oriented ferroelectric thin film element, which comprises:

a single-crystal substrate;

a first epitaxial or oriented ferroelectric thin film prepared by a gas phase growth method on said substrate, said first ferroelectric thin film having a thickness of 50 Å or more and having a first surface disposed away from said substrate; and a second epitaxial or oriented ferroelectric thin film prepared by application of a coating solution of an organic metal compound to said first ferroelectric thin film followed by heating the coated material said second ferroelectric thin film having a second surface disposed away from said first ferroelectric thin film, wherein said second surface is smoother than said first surface.

2. The oriented ferroelectric thin film element according to claim 1, wherein said single-crystal substrate comprises a single crystal of oxide.

3. The oriented ferroelectric thin film element according to claim 1, wherein said single-crystal substrate comprises a semiconductor.

4. The oriented ferroelectric thin film element according to claim 1, wherein said single-crystal substrate comprises a semiconductor having thereon an epitaxial buffer layer.

5. The oriented ferroelectric thin film element according to claim 1, wherein said gas phase growth method is electron-beam deposition method, Rf-magnetron sputtering method, laser ablation method or organic metal chemical vapor deposition.

6. The oriented ferroelectric thin film element according to claim 1, wherein said organic metal compound is selected from the group consisting of metal alkoxides and metallic salts.

7. The oriented ferroelectric thin film element according to claim 1, wherein said application of a coating solution of an organic metal compound followed by heating the coated material is repeated a plurality of times to form a second epitaxial or oriented ferroelectric thin film.

8. A process for preparing an oriented ferroelectric thin film, which comprises:

forming a first epitaxial or oriented ferroelectric thin film on a single-crystal substrate by a gas phase growth method said first ferroelectric thin film having a thickness of 50 Å or more and having a first surface disposed away from said substrate;

applying a coating solution of an organic metal compound to said first ferroelectric thin film; and then heating the coated material to form a second epitaxial or oriented ferroelectric thin film on said first ferroelectric thin film, said second ferroelectric thin film having a second surface disposed away from said first ferroelectric thin film;

wherein said second surface is smoother than said first surface.

9. The process for preparing an oriented ferroelectric thin film according to claim 8, wherein said single-crystal substrate comprises a single crystal of oxide.

10. The process for preparing an oriented ferroelectric thin film according to claim 8, wherein said single-crystal substrate comprises a semiconductor.

11. The process for preparing an oriented ferroelectric thin film according to claim 8, wherein said single-crystal substrate comprises a semiconductor having thereon an epitaxial buffer layer.

12. The process for preparing an oriented ferroelectric thin film according to claim 8, wherein said gas phase growth method is electron-beam deposition method, Rf-magnetron sputtering method, laser ablation method or organic metal chemical vapor deposition.

13. The process for preparing an oriented ferroelectric thin film according to claim 8, wherein said organic metal compound is selected from the group consisting of metal alkoxides and metallic salts.

14. The process for preparing an oriented ferroelectric thin film according to claim 8, wherein said application of a coating solution of an organic metal compound followed by heating the coated material is repeated a plurality of times to form a second epitaxial or oriented ferroelectric thin film.

15. An oriented ferroelectric thin film element, comprising:

a single-crystal substrate;

a first epitaxial or oriented ferroelectric thin film on said substrate, said first ferroelectric thin film having a thickness of 50 Å or more and having a first surface disposed away from said substrate; and a second epitaxial or oriented ferroelectric thin film on said first surface of said first ferroelectric thin film, said second ferroelectric thin film having a second surface disposed away from said first ferroelectric thin film, wherein said second surface is smoother than said first surface.

16. The oriented ferroelectric thin film element according to claim 1, wherein optical guide loss measurements, using the He—Ne laser light, of said ferroelectric thin film element show $TE_0$ mode attenuation of not more than 10 dB/cm.

17. The oriented ferroelectric thin film element according to claim 15, wherein optical guide loss measurements, using the He—Ne laser light, of said ferroelectric thin film element show $TE_0$ mode attenuation of not more than 10 dB/cm.

* * * * *